(12) United States Patent
Wi et al.

(10) Patent No.: US 9,882,584 B2
(45) Date of Patent: Jan. 30, 2018

(54) DVB-S2 LDPC DECODER USING OVERLAPPED DECODING SCHEME

(71) Applicant: KOREA UNIVERSITY RESEARCH AND BUSINESS FOUNDATION, Seoul (KR)

(72) Inventors: Jun-Young Wi, Gyeonggi-do (KR); Jun Heo, Seoul (KR); Sung Won Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 15/132,585

(22) Filed: Apr. 19, 2016

(65) Prior Publication Data
US 2017/0063395 A1    Mar. 2, 2017

(30) Foreign Application Priority Data

Aug. 27, 2015 (KR) ........................ 10-2015-0121044

(51) Int. Cl.
*H03M 13/00* (2006.01)
*H03M 13/11* (2006.01)

(52) U.S. Cl.
CPC ...... *H03M 13/112* (2013.01); *H03M 13/1137* (2013.01); *H03M 13/1165* (2013.01)

(58) Field of Classification Search
CPC ........... H03M 13/112; H03M 13/1137; H03M 13/1165
See application file for complete search history.

(56) References Cited

U.S. PATENT DOCUMENTS

| 2004/0034828 | A1* | 2/2004 | Hocevar | H03M 13/1114 714/800 |
| 2005/0229090 | A1* | 10/2005 | Shen | H03M 13/1137 714/801 |
| 2008/0082868 | A1* | 4/2008 | Tran | H03M 13/1117 714/699 |

FOREIGN PATENT DOCUMENTS

KR    1009229560000    10/2009

OTHER PUBLICATIONS

Byun, Y.K., et al., "An Efficient Overlapped LDPC Decoder with a Upper Dual-diagonal Structure," Journal of Semiconductor Technology and Science, Feb. 2013, vol. 13, No. 1, pp. 8-14.

Yanni, C., et al., "Overlapped Message Passing for Quasi-Cyclic Low-Density Parity Check Codes," IEEE Transactions on Circuits and Systems—I: Regular Papers, Jun. 2004, vol. 51, No. 6, pp. 1106-1113.

* cited by examiner

*Primary Examiner* — Sam Rizk
(74) *Attorney, Agent, or Firm* — Duane Morris LLP; J. Rodman Steele, Jr.; Gregory M. Lefkowitz

(57) ABSTRACT

Provided is a low density parity check decoder, which includes a bit node calculating unit configured to calculate a bit node, a check node calculating unit configured to calculate a check node, a control unit configured to control calculation of the bit node and the check node, and a storage unit configured to store calculation values of the bit node or the check node, wherein the control unit calculates the bit node or the check node so that the node calculations are overlapped, by using an address offset value of the storage unit, thereby reducing a decoding time.

6 Claims, 8 Drawing Sheets

FIG. 5
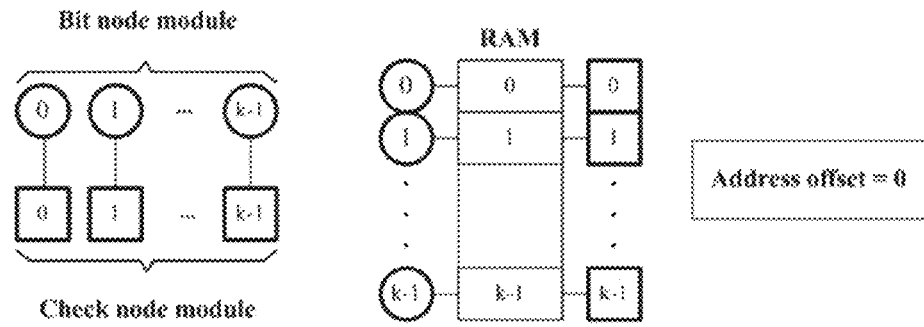
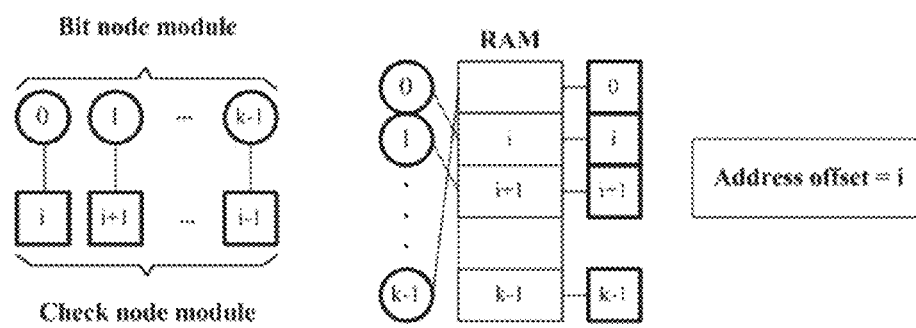
FIG. 6
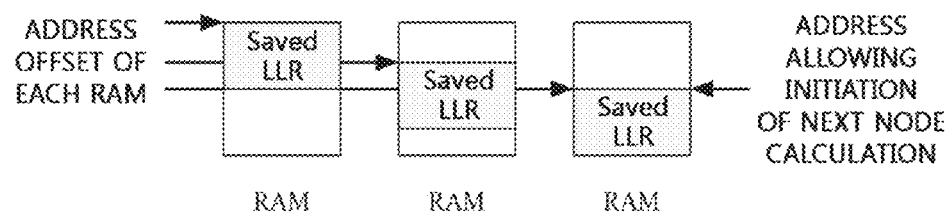

DVB-S2 LDPC DECODER USING OVERLAPPED DECODING SCHEME

CROSS-REFERENCE TO RELATED APPLICATIONS

This application claims priority under 35 U.S.C. § 119 to Korean Patent Application No. 10-2015-0121044 filed on Aug. 27, 2015, in the Korean Intellectual Property Office, the disclosure of which is incorporated herein by reference in its entirety.

TECHNICAL FIELD

The following disclosure relates to a low density parity check decoder, and in particular, to a low density parity check decoder having a reduced decoding time by overlapped calculation and a designing method thereof.

BACKGROUND

A communication system uses an error correcting code in order to ensure reliable communication through a channel. A low density parity check (LDPC) code exhibiting performance close to the Shannon limit is a representative error correcting code. The LDPC code has higher performance in comparison to a turbo code as a message size is greater, and does not show an error floor at relatively high SNR (Signal to Noise Ratio). The LDPC code may be expressed using a Tanner graph which shows a connection state according to edges between a bit node and a check node. A LDPC decoder operates by operating and updating information transferred along the edges between nodes on the Tanner graph.

Generally, the LDPC code has very great coding complexity, and thus leads to excessive use of a system storage and becomes a main restraint factor when implementing LDPC codes. In addition, when implementing LDPC codes, access conflict among memories storing bit nodes, check nodes, and their input/output values may cause serious problems. Therefore, an efficient decoder structure capable of solving these problems is needed.

RELATED LITERATURES

Patent Literature

Korean Unexamined Patent Publication No. 10-2005-0035729, entitled "Method for encoding low density parity check codes"

SUMMARY

An embodiment of the present disclosure is directed to providing a low density parity check decoder, which has a reduced decoding time by means of overlapped calculation.

An embodiment of the present disclosure is also directed to providing a method for designing a low density parity check decoder, which has a reduced decoding time by means of overlapped calculation.

In one general aspect, there is provided a low density parity check decoder, comprising: a bit node calculating unit configured to calculate a bit node; a check node calculating unit configured to calculate a check node; a control unit configured to control calculations of the bit node and the check node; and a storage unit configured to store calculation values of the bit node or the check node, wherein the control unit calculates the bit node or the check node so that the node calculations are overlapped, by using an address offset value of the storage unit.

According to another embodiment of the present disclosure, the control unit may calculate address offset values of storage units connected to the bit node calculating unit or check node calculating unit, which performs calculation first, arrange the address offset values in ascending order, calculate value differences among the arranged address offset values, and control so that a next node calculation is performed from a smaller address offset value of two address offset value having a greatest value difference.

According to another embodiment of the present disclosure, the value difference of the two address offset values having a greatest value difference may be a maximum time reducible by means of overlapping.

According to another embodiment of the present disclosure, the address offset of the storage unit may be calculated using DVB-S2 LDPC standard.

In another aspect of the present disclosure, there is provided a method for designing a low density parity check decoder, comprising: calculating address offset values of storage units respectively connected to node calculating units; arranging the address offset values in ascending order, and calculating value differences among the arranged address offset values; and designing so that a next node calculation is performed from a smaller address offset value of two address offset value which have a greatest value difference between the address offset values.

According to another embodiment of the present disclosure, the value difference of the two address offset value having a greatest value difference may be a maximum time reducible by means of overlapping.

According to another embodiment of the present disclosure, the address offset of the storage unit may be calculated using DVB-S2 LDPC standard.

According to the present disclosure, a decoding time may be reduced by overlapping bit node calcination and check node calculation, by means of a connection relationship among bit nodes, check nodes and RAMs, when implementing a LDPC decoder of a partial parallel structure. In addition, decoding time may be reduced differently depending on various code ratios of DVB-S2 standard. If the DVB-S2 system may enhance a bit transfer rate input to a LDPC system serving as an error correcting portion, the decoding time reduced according to this technique may lead to an increase of a processing ratio. This is because the reduction of the decoding time and the increase of the processing ratio are directly associated using an equation. In addition, if the DVB-S2 system gives a fixed bit transfer rate due to various limitations, the reduced decoding time may be used for additional LDPC iterative decoding, by which performance improvement may be expected. In other case, a decoding algorithm having low complexity and deteriorated performance may be used together with additional iterative decoding, which may give performance in a similar level in comparison to an existing decoding algorithm but reduce an area used by hardware when the system is implemented.

BRIEF DESCRIPTION OF THE DRAWINGS

FIG. 5 is a diagram for illustrating an address offset for storing calculated node group value in a RAM.

FIG. 6 is a diagram for illustrating a principle of a node calculation overlapping technique using an address offset value of the RAM.

DETAILED DESCRIPTION OF EMBODIMENTS

Figure 1:
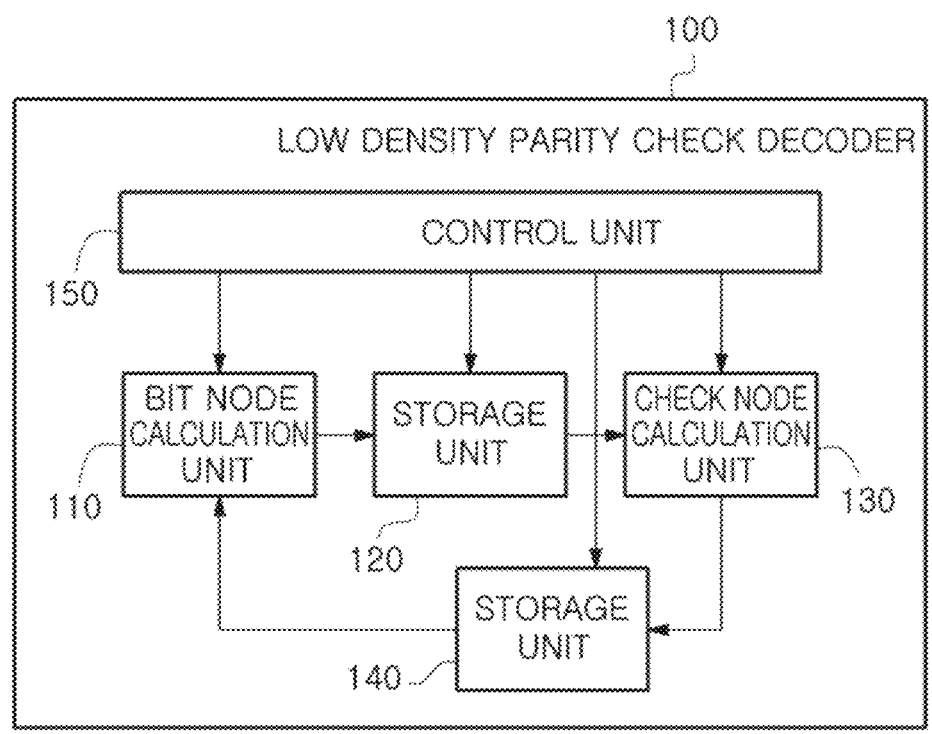
FIG. 1 is a block diagram showing a low density parity check (LDPC) decoder according to an embodiment of the present disclosure.

Prior to the explanation of the present disclosure, solutions or technical spirit of the present disclosure will be summarized or essentially proposed for convenient understanding.

A low density parity check decoder according to an embodiment of the present disclosure includes a bit node calculating unit configured to calculate a bit node, a check node calculating unit configured to calculate a check node, a control unit configured to control calculations of the bit node and the check node, and a storage unit configured to store calculation values of the bit node or the check node, wherein the control unit calculates the bit node or the check node so that the node calculations are overlapped, by using an address offset value of the storage unit.

Hereinafter, embodiments of the present disclosure, which can be easily implemented by those skilled in the art, are described in detail with reference to the accompanying drawings. However, these embodiments are just for better understanding of the present disclosure, and it will be obvious to those skilled in the art that the scope of the present disclosure is not limited to these embodiments.

In addition, throughout the entire specification, when any portion is 'connected or attached' to another portion, this encompasses not only a case where any portion is 'directly connected or attached' to another portion but also a case where any portion is 'indirectly connected or attached' to another portion. In this specification, the singular forms "a", "an" and "the" are intended to include the plural forms as well, unless the context clearly indicates otherwise. It will be further understood that the terms "comprises" and/or "comprising", when used in this specification, specify the presence of stated features, steps, operations, and/or elements, but do not preclude the presence or addition of one or more other features, steps, operations, elements, and/or components thereof.

The present disclosure may be modified in various ways and have various embodiments, and specific embodiments will be illustrated in the drawings and explained. However, it is not intended to limit the present disclosure to specific embodiments, but it should be understood that the present disclosure includes all modifications, equivalents and substitutes falling within the scope thereof.

The configuration of the present disclosure will be described in detail with reference to the accompanying drawings based on the embodiments of the present disclosure to clearly understand the solutions of the present disclosure. Here, when any drawing is explained, a component depicted in another drawing may also be cited, if necessary. Moreover, when explaining an operation principle of an embodiment of the present disclosure, detailed explanation of any known function or configuration related to the present disclosure or other matters may be omitted if it may unnecessarily make the essence of the present disclosure confused.

FIG. 1 is a block diagram showing a low density parity check (LDPC) decoder according to an embodiment of the present disclosure.

A low density parity check decoder 100 according to an embodiment of the present disclosure includes a bit node calculating unit 110, a check node calculating unit 130, a control unit 150, and storage units 120,140.

A LDPC code, which is one of error correcting codes, is widely used in the fields requiring high data-rate such as WLAN, Wimax, and DVB-S2 due to its excellent performance and paralleled decoder structure. In particular, DVB-S2 standard gives various kinds of service such as high-definition satellite broadcasting such as HDTV, bi-directional data communications or the like. In order to give high-quality service in such a communication system, data capacity increases, and a data processing time at a receiver increases. Thus the LDPC code serving as an error correcting code is widely used to ensure a high processing ratio (throughput).

The LDPC decoder is generally classified into three types. These types include a serial decoder, a parallel decoder, and a partial parallel decoder. The serial decoder uses small system storage but has a low processing ratio. On the contrary, the parallel decoder exhibits a high processing ratio but use very large system capacity. The partial parallel decoder may be advantageously designed consideration of a processing ratio and storage demanded by a system.

When bit nodes and check nodes of the LDPC code are calculated in order, the system complexity is not so great. However, the LDPC decoder becomes slow. In order to process several thousand or several ten thousand bits demanded by a communication system, several thousand or several ten thousand bit node and check nodes corresponding thereto are required, but if they are processed in order, the speed of the LDPC decoder is inevitably decreased.

When bit nodes and check nodes are calculated in parallel, a decoding rate increases, but system complexity greatly increases. If numerous bit nodes and check nodes are processed at once in parallel as in the above, the decoding speed will increase, but since a greater system hardware area is used as much as the number of bit nodes and check nodes, the system complexity is inevitably increased. In order to implement an efficient LDPC decoder, it is needed to compromise between hardware performance (decoding rate) and system complexity. The partial parallel decoder may fulfill this structure in a partial parallel processing method of the decoder, a node calculating module is implemented by means of node grouping according to the DVB-S2 standard characteristic pattern on a Tanner graph, and an information value serving as an input of the calculation module is designed to be input without any conflict from a memory.

When the LDPC decoder of a partial parallel structure is actually implemented as hardware, a random access memory (RAM) is required to provide input values for calculating bit nodes and check nodes and store calculation results of the bit nodes and the check nodes. At this time, in order to prevent node calculation order from being entangled, rules are regulated for each node to read values from the ROM and store values into the RAM. Generally, when each node reads a value from the RAM, values are read in order from a first address of the RAM, and when each node stores a calculation result value in the RAM, an address offset value of the RAM is considered. The address offset of the RAM is a value which may be obtained based on DVB-S2 standard. If the process of storing calculation result values using the address offset values of the RAM and the process of reading values required for calculation are overlapped, the time required for LDPC decoding may be reduced.

The low density parity check decoder 100 according to an embodiment of the present disclosure may reduce a decoding time of the system while maintaining the decoding performance in the same level by partially overlapping bit node calculation and check node calculation, which have been separated, by using connection relationship of the bit node calculating unit, the check node calculating unit, and the storage unit.

The bit node calculating unit 110 calculates bit nodes, the check node calculating unit 130 calculates check nodes, and the storage units 120,140 store calculation result values of each calculating unit.

The control unit 150 controls bit node calculation and check node calculation.

In more detail, the control unit 150 calculates bit nodes or check nodes so that the node calculations are overlapped, by using the address offset values of the storage units. By doing so, the calculation efficiency may be enhanced.

Figure 2:
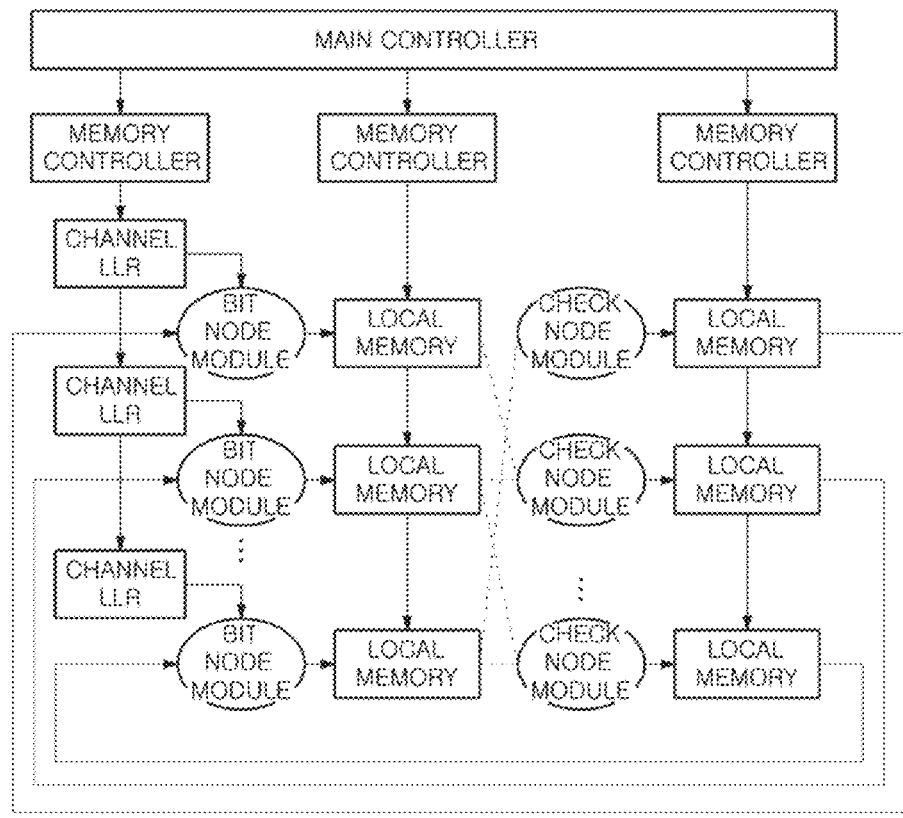
FIG. 2 shows an overall configuration of a partial parallel decoder for LDPC codes.
Figure 3:
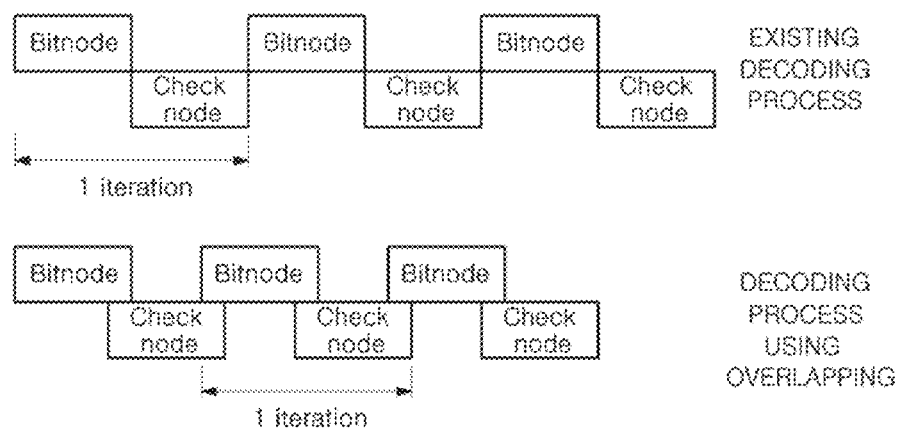
FIG. 3 compares an existing LDPC decoding process with a decoding process using overlapped calculation.
Figure 4:
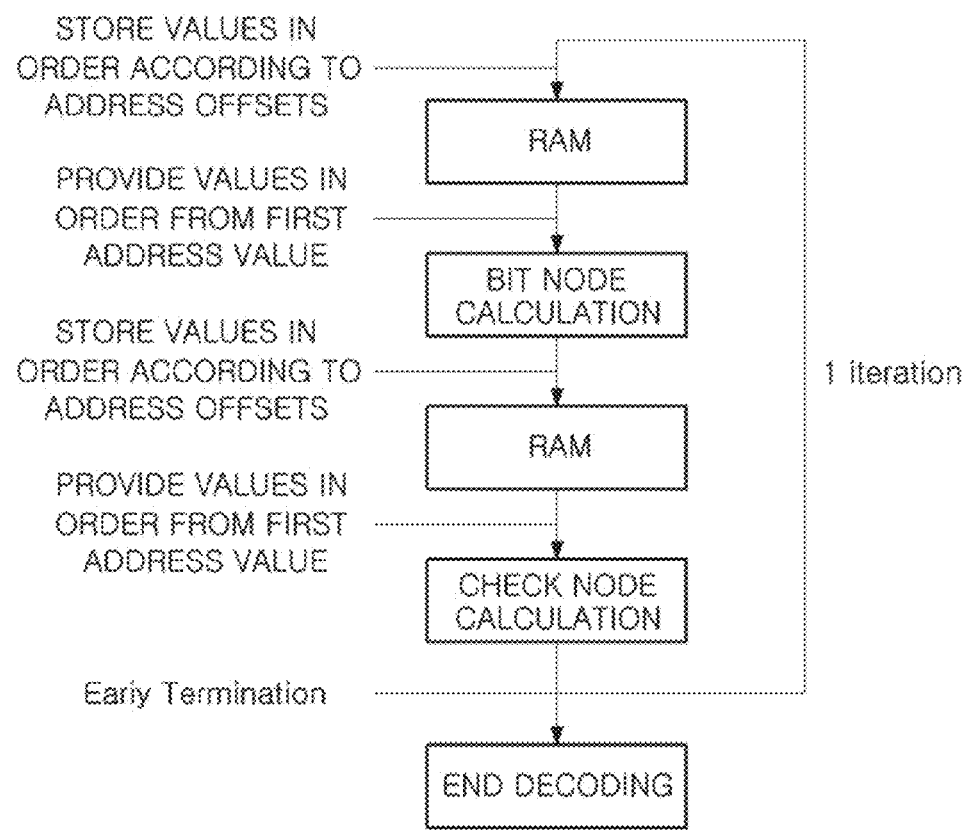
FIG. 4 shows a connection state between a random access memory (RAM) and a node module having a partial parallel decoding structure for LDPC codes.

As shown in FIG. 2, in a partial parallel decoding structure of the LDPC decoder, it is initiated to calculate check nodes after all bit nodes are calculated, and it is initiated to calculate bit nodes after all check nodes are calculated. If it is possible to calculate some check nodes before all bit node are calculated, the time required for a single decoding process may be shortened. FIG. 3 compares an existing LDPC decoding recess with a decoding process using overlapped node calculation. The existing decoder of a partial parallel structure has a following calculation order. First, values required for calculating bit nodes (check nodes) are read in order from a first address of the storage unit. Calculation result values obtained by calculating nodes with the read values are stored in order at each storage unit on the basis of the address offset value. This process may be illustrated as in FIG. 4. The address offset value is an element prepared according to DVB-S2 standard, and this will be described below with reference to FIG. 5. Even though the bit node calculating unit and the check node calculating unit are connected in the same way as FIG. 4, bit nodes and check nodes in the calculating units may be connected in a different way. In order to match different connection states of bit nodes and check nodes in the node calculating unit, the calculation values of the bit nodes are stored in the storage unit in consideration of the address offset values. While the calculation result values are stored in accordance with the address offset value of each RAM (storage unit) as shown in FIG. 6, all input values required for node calculation of a next stage may be entirely prepared. Therefore, without waiting until all calculation result values are stored in the next-stage node calculation may be initiated in the middle thereof. By means of node calculation overlapping using the same, a processing time may be reduced as much as the time during which the other calculation results of the node calculating unit are stored. The time reducible by means of node calculation overlapping is differently calculated for each node group since address offset values of RAMs are different from each other, and in the present disclosure, the decoder is designed so that a smallest time among reducible times calculated by the node overlapping technique for all node groups is reduced in the entire system, for ensuring stable operations of the LDPC decoding system.

For efficient overlapping of node calculations, the control unit 150 calculates address offset value of storage unit 120 connected to the bit node calculating unit 110 or the check node calculating unit 130, which performs calculation first, arranges the address offset values in ascending order, calculates value differences among the arranged address offset values, and controls so that a next node calculation is performed from a smaller address offset value of two address offset values having a greatest value difference. The value difference of the two address offset values having a greatest value difference becomes a maximum time reducible by means of overlapping. The address offset of the storage unit may be calculated using DVB-S2 LDPC standards.

Figure 7:
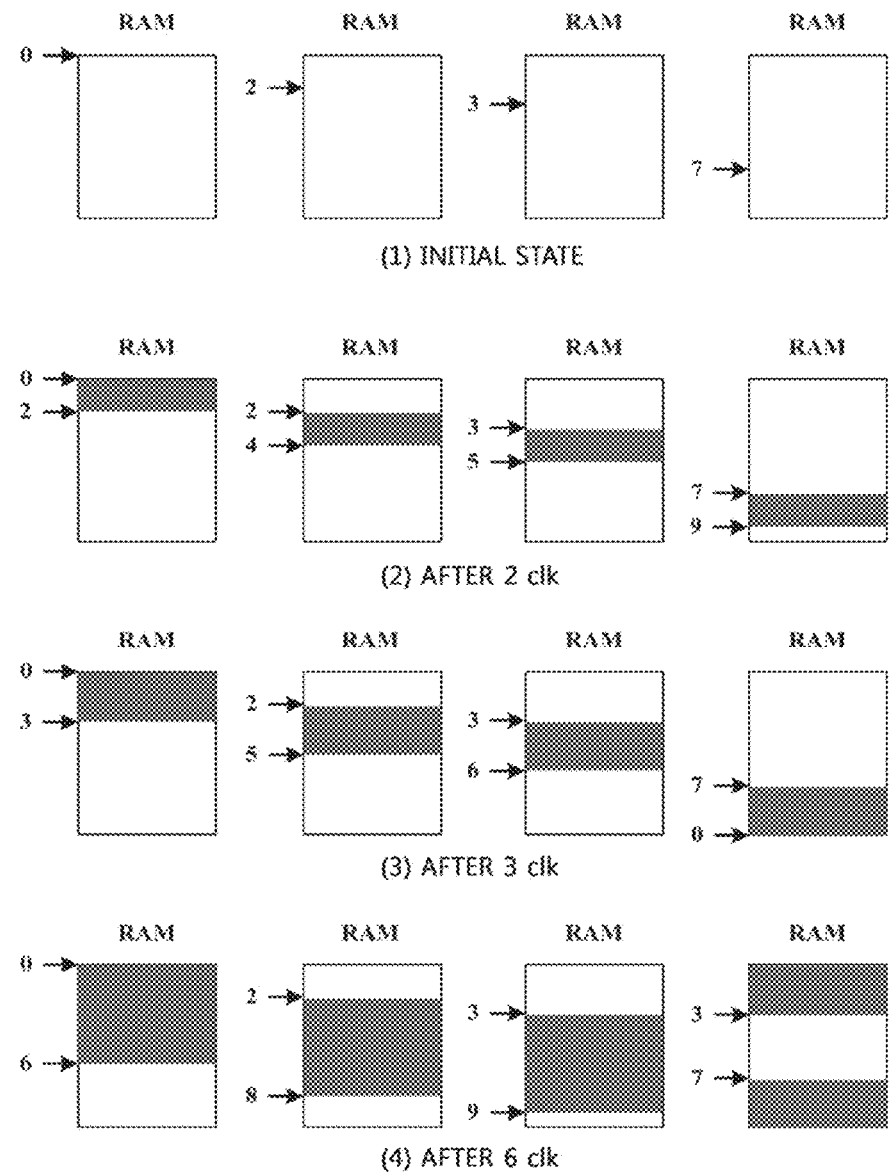
FIG. 7 is a diagram for illustrating a node calculation overlapping technique.

By using a simple example depicted in FIG. 7 showing a connection state between a single node group and a RAM (storage unit) appropriate to its order, it will be described how much time can be reduced by means of the node calculation overlapping. For this, it is assumed that the decoder includes a bit node calculating unit, a storage unit and a check node calculating unit, which are connected in this order. The orders of the bit node calculating unit and the check node calculating unit may be changed. In FIG. 7, the order of the check node calculating unit is 4, and the number of RAMs (storage units) is 4 accordingly. In an initial state, the bit node calculating unit should store 10 result values in the RAMs, and the address offset values of the RAMs may be respectively 0, 2, 3, 7. It is assumed that a unit time clk is required for storing a single value. If 2 clk passes as shown in FIG. 7(2), all RAMs store values at two addresses from the address offset value. If 3 clk passes, as shown in FIG. 7(3), four RAMs store values at three addresses in order from the address offset value. Seeing FIG. 7(4), it may be found that when 6 clk passes, the first RAM stores result values at first to sixth addresses, the second RAM stores result values at third to eighth addresses, the third RAM stores result values at fourth to ninth addresses, and the fourth RAM stores result values at eighth to tenth addresses and first to third addresses. Therefore, since a result value is stored at the fourth address value of all RAMs from the seventh clk, it is possible to initiate calculating check nodes by using the address, to be overlapped with the bit node calculating process. Since the node calculation overlapping is available from the seventh clk, it may also be found from the example that 4 clk can be reduced from 10 clk in total, required for storing values.

The maximum time reducible by the node calculation overlapping may be calculated using the following process. At first, address offset values of all storage units respectively connected to node calculating units are obtained. In addition, these values are arranged in ascending order, and then a value difference between each value and its next value is obtained. Among the value differences, a greatest value becomes a reducible maximum time, and the address offset value associated with the value difference becomes a decoding initiation address value at which a next node calculation may be performed during the storing process. In FIG. 7, since the RAMs respectively have the address offset values of 0, 2, 3 and 7, 4 is a greatest difference among them, which is a reducible time, and a next node calculation may be performed at the address offset value of 3 (the third RAM address) associated with the difference.

Figure 8:
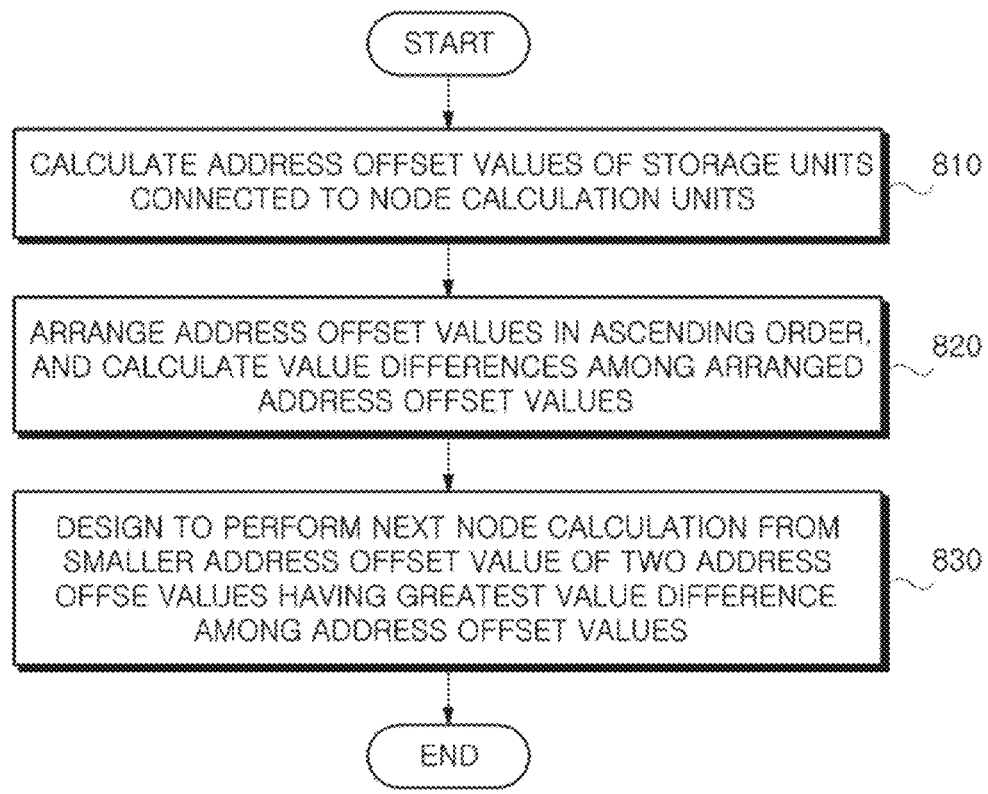
FIG. 8 is a flowchart for illustrating a method for designing a low density parity check decoder according to an embodiment of the present disclosure.

FIG. 8 is a flowchart for illustrating a method for designing a low density parity check decoder according to an embodiment of the present disclosure.

The detailed description with respect to FIG. 8 corresponds to the above description with respect to FIGS. 1 to 7, and thus repeated explanations will be omitted below.

In Step 810, address offset values of storage units respectively connected to the node calculating units are calculated.

In more detail, in order to calculate the degree of overlapping of node calculations, address offset values of storage units respectively connected to the node calculating units are calculated. The address offset values of the storage units may be calculated using DVB-S2 LDPC standard.

In Step 820, the address offset values are arranged in ascending order, and value differences among the arranged address offset values are calculated.

In more detail, in order to calculate address offsets used for overlapping and the degree of overlapping from the address offset values, the address offset values calculated in Step 810 are arranged in ascending order, and value differences among the arranged address offset values are calculated.

In Step 830, it is designed so that a next node calculation is performed from a smaller address offset value of two address offset value which have a greatest value difference between the address offset values.

In more detail, two address offset values having a greatest value difference therebetween are selected from the address offset values calculated in Step 820, and it is designed so that a next node calculation is performed from a smaller address offset value of the selected two address offset values. The value difference of the two address offset values having a greatest value difference is a maximum time reducible by means of overlapping.

Table 1 below shows one-time decoding time reduction according to node calculation overlapping for each code rate of DVB-S2 LDPC code short frame standard.

TABLE 1

| Code rate | Number of clk required for system operation | Number of clk reducible by overlapping | Reduction rate of clk (%) |
|---|---|---|---|
| 1/4 | 733 | 144 | 19.6 |
| 1/3 | 733 | 118 | 16.1 |
| 2/5 | 733 | 107 | 14.6 |
| 1/2 | 733 | 114 | 15.6 |
| 3/5 | 733 | 79 | 10.8 |
| 2/3 | 733 | 87 | 11.9 |
| 3/4 | 733 | 70 | 9.5 |
| 4/5 | 733 | 92 | 12.6 |
| 5/6 | 733 | 67 | 9.1 |
| 8/9 | 733 | 56 | 7.6 |

The decoding time reduced as above may be utilized in two ways. First, if a bit transfer rate of the entire system may be enhanced, a bit processing ratio may be enhanced using a bit processing ratio equation directly connected to the decoding time. An equation for calculating the bit processing ratio is as follows.

$$T = \frac{I}{cyc} \cdot f_{cyc} \qquad \text{Equation 1}$$

I is a length of an information block, #cyc is an entire decoding time (clk) of the system required for processing a single block, and $f_{clk}$ is a system operation frequency of hardware. Since the entire decoding time, namely #cyc, reduced, the bit processing ratio may be naturally increased.

Figure 9:
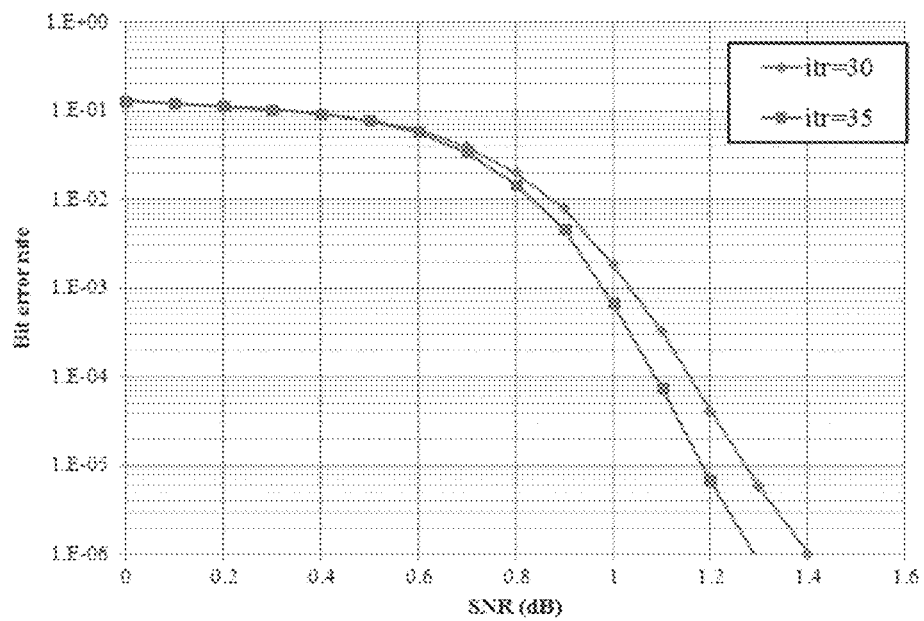
FIGS. 9 to 11 show simulation results.
Figure 10:
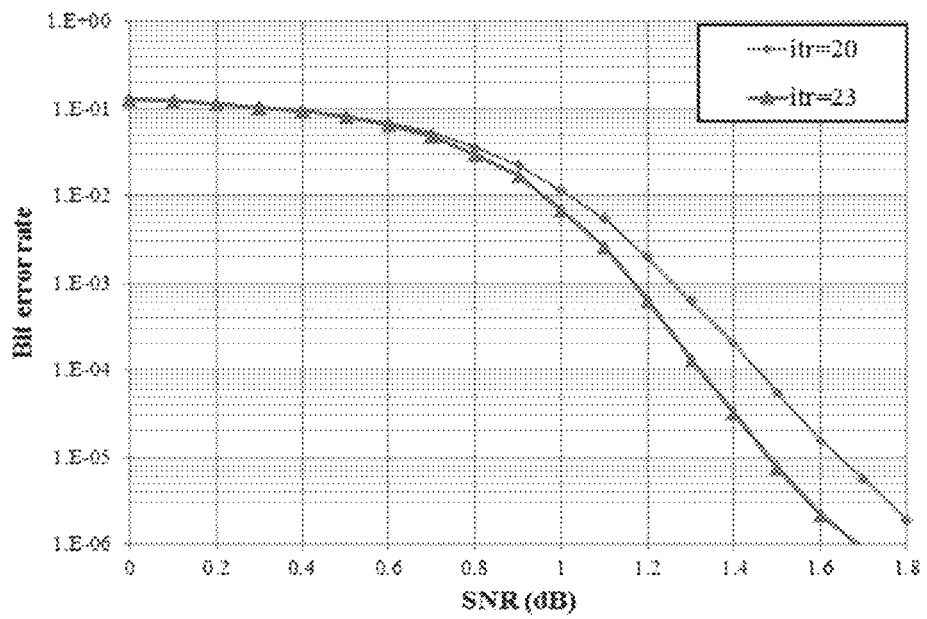

It may be impossible to enhance a bit transfer rate in the entire DVB-S2 communication system, due to various limitations. When the time reduced by the method for designing a decoder according to an embodiment of the present disclosure is used for an additional decoding process, the following effects may be obtained. In FIGS. 9 and 10, performance analyzed on the basis of 30-time iterative decoding and 20-time iterative decoding at ½ code rate of DVB-S2 short frame standard. FIG. 9 compares a case where existing iterative decoding is performed 30 times and a case where iterative decoding is additionally performed five times according to the decoder designing method according to an embodiment of the present disclosure. Similarly, FIG. 10 compares a case where existing iterative decoding is performed 30 times and a case where iterative decoding is additionally performed three times according to the decoder designing method according to an embodiment of the present disclosure. As seen from the performance curves, performance improvement may be expected using additional iterative decoding obtained by the node calculation overlapping technique.

As a decoding algorithm of the LDPC code, a min*-sum algorithms which complexity of node calculation of a sum-product algorithm, which is an optimal decoding method, is lowered by means of log-MAP is used, and here a check node calculating portion for min* calculation has highest complexity in the LDPC decoding. Check node calculation of the min*-sum decoding algorithm is expressed with the following process.

Assuming that $v_{n_1 \to k}, v_{n_2 \to k}, \ldots, v_{n_{dc} \to k}$ is an information message input to a check node k from the $d_c$ number of adjacent bit nodes and $w_{k \to n_1}, w_{k \to n_2}, \ldots, w_{k \to n_{dc}}$ is an information message input to the $d_c$ number of adjacent bit nodes from the check node k, the information message value updated from the check node k may be expressed as:

$$w_{k \to n_i} = g(v_{n_1 \to k}, \ldots, v_{n_{i-1} \to k}, v_{n_{i+1} \to k}, \ldots, v_{n_{dc} \to k})$$

In other words, the information message input from the $d_c-1$ number of bit nodes, where a single bit node to which an information message is to be sent after updating the check node is excluded, is recursively calculated as a g function.

At this time, the g( ) function is a min*-sum algorithm, and its detailed equation is as follows.

$$g(a, b) = \text{sign}(a) \times \text{sign}(b) \times \min(|a|, |b|) + \ln\frac{(1 + e^{-|a+b|})}{(1 + e^{-|a-b|})}$$

The min-sum decoding algorithm which has performance deterioration in comparison to the min*-sum decoding algorithm but ensures lower decoding performance goes through a process such as the min*-sum algorithm as above, or g( ) is changed as follows.

Figure 11:
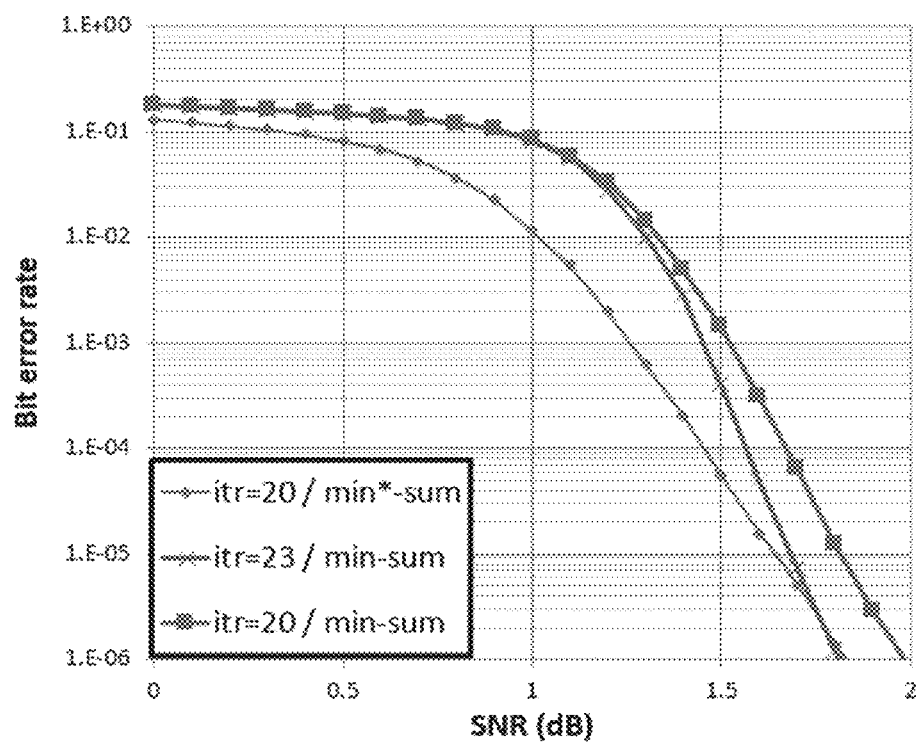

In FIG. 11, the performance of the min*-sum algorithm, which performs iterative decoding 20 times at ½ code rate of DVB-S2 short frame standard, and the min-sum algorithm, which additional iterative decoding three times as obtained by the node overlapping technique, is analyzed. As shown in FIG. 11, it may be found that the min-sum algorithm performing iterative decoding 23 times has improved performance in comparison to the min*-sum algorithm performing iterative decoding 20 times. Since the decoding complexity is decreased when the min-sum algorithm is used, if this is implemented hardware, an area used by the system may also be reduced. Through various results, it is found that system performance may be enhanced by means of additional iterative decoding, performed by using the reduced time, and an area used by the system may be reduced while maintaining performance in a similar level in comparison to an existing decoding algorithm by using a decoding algorithm with somewhat low complexity and additional iterative decoding together.

While the exemplary embodiments have been shown and described, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof.

Therefore, it is intended that this disclosure not be limited to the particular exemplary embodiments disclosed as the best mode contemplated for carrying out this disclosure, but that this disclosure will include all embodiments falling within the scope of the appended claims.

REFERENCE SYMBOLS

100: low density parity check decoder
110: bit node calculating unit
120, 140: storage unit
130: check node calculating unit
150: control unit

What is claimed is:

1. A low density parity check decoder, comprising:
a bit node calculating unit configured to calculate a bit node;
a check node calculating unit configured to calculate a check node;
a control unit configured to control calculations of the bit node and the check node; and
a storage unit configured to store calculation values of the bit node or the check node,
wherein the control unit calculates the bit node or the check node so that the node calculations are overlapped, by using an address offset value of the storage unit,
wherein the control unit calculates address offset values of storage units connected to the bit node calculating unit or check node calculating unit, which performs calculation first, arranges the address offset values in ascending order, calculates value differences among the arranged address offset values, and controls so that a next node calculation is performed from a smaller address offset value of two address offset value having a greatest value difference.

2. The low density parity check decoder according to claim 1, wherein the value difference of the two address offset values having a greatest value difference is a maximum time reducible by means of overlapping.

3. The low density parity check decoder according to claim 1, wherein the address offset of the storage unit is calculated using DVB-S2 LDPC standard.

4. A method for implementing a low density parity check decoder, comprising:
providing a low density parity check decoder according to claim 1;
calculating address offset values of storage units respectively connected to node calculating units;
arranging the address offset values in ascending order, and calculating value differences among the arranged address offset values; and
designing so that a next node calculation is performed from a smaller address offset value of two address offset value which have a greatest value difference between the address offset values.

5. The method for implementing a low density parity check decoder according to claim 4, wherein the value difference of the two address offset values having a greatest value difference is a maximum time reducible by means of overlapping.

6. The method for implementing a low density parity check decoder according to claim 4, wherein the address offset of the storage unit is calculated using DVB-S2 LDPC standard.

* * * * *